United States Patent
Latypov et al.

(10) Patent No.: US 9,023,730 B1
(45) Date of Patent: May 5, 2015

(54) METHODS FOR FABRICATING INTEGRATED CIRCUITS INCLUDING GENERATING E-BEAM PATTERNS FOR DIRECTED SELF-ASSEMBLY

(71) Applicant: GLOBALFOUNDRIES, Inc., Grand Cayman (KY)

(72) Inventors: Azat Latypov, San Jose, CA (US); Yi Zou, Foster City, CA (US); Vito Dai, Santa Clara, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 1 day.

(21) Appl. No.: 14/072,164

(22) Filed: Nov. 5, 2013

(51) Int. Cl.
*H01L 21/311* (2006.01)
*G06F 17/50* (2006.01)
*H01L 21/027* (2006.01)
*H01L 21/033* (2006.01)

(52) U.S. Cl.
CPC ........ *G06F 17/5081* (2013.01); *H01L 21/0273* (2013.01); *H01L 21/0337* (2013.01)

(58) Field of Classification Search
USPC ............................................ 438/694; 716/55
See application file for complete search history.

(56) References Cited

U.S. PATENT DOCUMENTS

| | | | |
|---|---|---|---|
| 6,745,380 B2 | 6/2004 | Bodendorf et al. | |
| 7,237,221 B2 | 6/2007 | Granik et al. | |
| 7,521,094 B1 | 4/2009 | Cheng et al. | |
| 7,861,207 B2 | 12/2010 | Word et al. | |
| 7,903,856 B2 | 3/2011 | Pfister et al. | |
| 8,045,785 B2 | 10/2011 | Kitamura et al. | |
| 8,155,649 B2 | 4/2012 | McHenry et al. | |
| 8,326,313 B2 | 12/2012 | McHenry et al. | |
| 8,336,003 B2 | 12/2012 | Cheng et al. | |
| 8,656,322 B1 | 2/2014 | Dechene et al. | |
| 8,667,428 B1 | 3/2014 | Latypov | |
| 8,667,430 B1 * | 3/2014 | Latypov | 716/51 |
| 2008/0212857 A1 | 9/2008 | Pfister et al. | |
| 2009/0132984 A1 | 5/2009 | Chander et al. | |
| 2010/0075704 A1 | 3/2010 | McHenry et al. | |
| 2010/0097952 A1 | 4/2010 | McHenry et al. | |
| 2010/0105332 A1 | 4/2010 | McHenry et al. | |
| 2010/0173586 A1 | 7/2010 | McHenry et al. | |

(Continued)

FOREIGN PATENT DOCUMENTS

| | | |
|---|---|---|
| JP | 200915491 A | 1/2009 |
| TW | 201124871 A1 | 7/2011 |

OTHER PUBLICATIONS

U.S. Appl. No. 13/936,924, filed Jul. 8, 2013.

(Continued)

*Primary Examiner* — Roberts Culbert
(74) *Attorney, Agent, or Firm* — Ingrassia Fisher & Lorenz, P.C.

(57) ABSTRACT

Methods for fabricating integrated circuits are provided. In one example, a method for fabricating an integrated circuit includes generating an e-beam pattern for forming a DSA directing pattern on a semiconductor substrate. The DSA directing pattern is configured to guide a self-assembly material deposited thereon that undergoes directed self-assembly (DSA) to form a DSA pattern. Generating the e-beam pattern includes using a computing system, inputting a DSA target pattern. Using the computing system, the DSA target pattern, a DSA model, and an EBPC model, an output EBPCed pattern is produced for an e-beam writer to write on a resist layer that overlies the semiconductor substrate.

20 Claims, 7 Drawing Sheets

(56) References Cited

U.S. PATENT DOCUMENTS

| | | |
|---|---|---|
| 2011/0209106 A1 | 8/2011 | Cheng et al. |
| 2012/0005634 A1 | 1/2012 | Seltmann et al. |
| 2012/0141924 A1 | 6/2012 | Sahouria |
| 2012/0329289 A1 | 12/2012 | Fujimura et al. |
| 2012/0331428 A1 | 12/2012 | Cheng et al. |
| 2013/0224635 A1 | 8/2013 | Takekawa et al. |
| 2013/0283216 A1 | 10/2013 | Pearman et al. |
| 2013/0283218 A1 | 10/2013 | Fujimura et al. |
| 2014/0127628 A1 | 5/2014 | Fujimura et al. |
| 2014/0229904 A1 | 8/2014 | Fujimura et al. |

OTHER PUBLICATIONS

Ji Xu, Introduction to Directed Self-Assembly (DSA) of Block Copolymer (BCP) in Thin Films, Jun. 29, 2011.
Azat Latypov, What is Directed Self-Assembly, Oct. 20, 2011.
Daniel J.C. Herr, Directed block copolymer self-assembly for nanoelectronics fabrication, J. Mater. Res., vol. 26, No. 2, Jan. 28, 2011.
Michael B. Giles and Niles A. Pierce, "An Introduction to the Adjoint Approach to Design", Flow, Turbulence and Combustion, 65(3-4):393-415, 2000.
H.-S. Philip Wong et al, "Block copolymer directed self-assembly enables sub-lithographic patterning for device fabrication", an oral presentation at the SPIE Advanced Lithography 2012 Symposium, to be published in the SPIE Advanced Lithography 2012 conference proceedings.
H.-S. Philip Wong, "Directed Self-Assembly for the Semiconductor Industry", an oral presentation at Globalfoundries, Inc. Feb. 3, 2012.
Chi-Chun Liu et al, "Progress towards the integration of optical proximity correction and directed self-assembly of block copolymers with graphoepitaxy", an oral presentation at the SPIE Advanced Lithography 2012 Symposium, to be published in the SPIE Advanced Lithography 2012 conference proceedings.
Wikipedia contributors, "Copolymer", Wikipedia, The Free Encyclopedia, <http://en.wikipedia.org/w/index.php?title=Copolymer&oldid=457198836>. Oct. 24, 2011.
M. W. Matsen, Self-consistent field theory and its applications. In Soft Matter, vol. 1: Polymer Melts and Mixtures, Edited by G. Gompper and M. Schick (Wiley-VCH, Weinheim, 2006). ISBN: 3-527-30500-9, <http://www.personal.rdg.ac.uk/~sps96mwm/matsen_scft.pdf>.
Wikipedia contributors, "Penalty method", Wikipedia, The Free Encyclopedia, <http://en.wikipedia.org/w/index.php?&oldid=465609685>. Dec. 13, 2011.
Wikipedia contributors, "Gradient descent", Wikipedia, The Free Encyclopedia, <http://en.wikipedia.org/w/index.php?&oldid=486689439>. Apr. 10, 2012.
Wikipedia contributors, "Newton's method in optimization", Wikipedia, The Free Encyclopedia, <http://en.wikipedia.org/w/index.php?&oldid=480670839>. Mar. 7, 2012.
Wikipedia contributors, "Non-linear least squares", Wikipedia, The Free Encyclopedia, <http://en.wikipedia.org/w/index.php?&oldid=481409505>. Mar. 11, 2012.
Wikipedia contributors, "Gauss-Newton algorithm", Wikipedia, The Free Encyclopedia, <http://en.wikipedia.org/w/index.php?&oldid=478249186>. Feb. 22, 2012.
Wikipedia contributors, "Levenberg-Marquardt algorithm", Wikipedia, The Free Encyclopedia, <http://en.wikipedia.org/w/index.php?&oldid=486636602>. Apr. 10, 2012.
Wikipedia contributors, "Quasi-Newton method", Wikipedia, The Free Encyclopedia, <http://en.wikipedia.org/w/index.php?&oldid=483333808>. Mar. 22, 2012.
Wikipedia contributors, "Conjugate gradient method", Wikipedia, The Free Encyclopedia, <http://en.wikipedia.org/w/index.php?&oldid=487492827>. Apr. 15, 2012.
Austen G.Duffy "An Introduction to Gradient Computation by the Discrete Adjoint Method", Technical report, Florida State University (2009), <http://computationalmathematics.org/topics/files/adjoint-techreport.pdf>.
U.S. Appl. No. 13/936,910, filed Jul. 8, 2013.
USPTO, Office Action for U.S. Appl. No. 13/936,924, mailed Jun. 17, 2014.
USPTO, Office Action for U.S. Appl. No. 13/936,910, mailed Jul. 3, 2014.
Taiwan Intellectual Property Office, Examination Report for Taiwanese Patent Application No. 102107449, mailed Jun. 19, 2014.
USPTO, Office Action for U.S. Appl. No. 13/659,453, mailed Jul. 9, 2013.
USPTO, Response to Office Action for U.S. Appl. No. 13/659,453, mailed Sep. 30, 2013.
USPTO, Notice of Allowance and Fee(s) Due for U.S. Appl. No. 13/659,453, mailed Oct. 15, 2013.
USPTO, Notice of Allowance and Fee(s) Due for U.S. Appl. No. 13/936,924, mailed Oct. 7, 2014.

\* cited by examiner

```
function DSA_directing_patterns = DSAPC(DSA_model,DSA_target_patterns, DSAPC_parameters)
DSA_directing_patterns_current(1) = initialize_DSA_patterns(DSA_model, DSA_target_patterns);
for iteration =1:DSAPC_parameters.n_iterations
    DSA_patterns = apply_DSA_model(DSA_directing_patterns_current(iteration), ...
                                   DSA_model);
    residual = compute_DSAPC_residual(DSA_patterns, ...
                                      DSA_target_patterns);
    if(DSAPC_norm(residual) < DSAPC_parameters.tolerance)
        DSA_directing_patterns = DSA_directing_patterns_current(iteration);
        return
    else
        DSA_directing_patterns_current(iteration+1) = DSAPC_update( ...
                                      DSA_directing_patterns_current(iteration), ...
                                      DSA_target_patterns, ...
                                      residual, ...
                                      DSA_model, ...
                                      DSAPC_parameters);
    end
end
disp('DSA PC iterations did not converge');
end
```

FIG. 4

```
function EBPCed_patterns = EBPC(EBPC_model,EBPC_target_patterns, EBPC_parameters)
EBPCed_patterns_current(1) = initialize_EBPCed_patterns(EBPC_model, EBPC_target_patterns);
for iteration =1:EBPC_parameters.n_iterations
    wafer_patterns = apply_EBPC_model(EBPCed_patterns_current(iteration), ...
                                       EBPC_model);
    residual = compute_EBPC_residual(wafer_patterns, ...
                                      EBPC_target_patterns);
    if(EBPC_norm(residual) < EBPC_parameters.tolerance)
        EBPCed_patterns = EBPCed_patterns_current(iteration);
        return
    else
        EBPC_patterns_current(iteration+1) = EBPC_update(EBPCed_patterns_current(iteration), ...
                                              EBPC_target_patterns, ...
                                              residual, ...
                                              EBPC_model, ...
                                              EBPC_parameters);
    end
end
disp('EBPC iterations did not converge');
end
```

FIG. 5

```
function EBPCed_patterns = FULLY_DECOUPLED_GLOBAL_FLOW(DSA_target_patterns, ...
                                                      DSA_model, DSAPC_parameters, ...
                                                      EBPC_model, EBPC_parameters)

DSA_directing_patterns = DSAPC(DSA_model,DSA_target_patterns, DSAPC_parameters);
EBPCed_patterns = EBPC(EBPC_model,DSA_directing_patterns, EBPC_parameters);
end
```

FIG. 6

```
function EBPCed_patterns = DECOUPLED_GLOBAL_FLOW_REALISTIC(DSA_target_patterns, ...
                                                          DSA_model, DSAPC_parameters, ...
                                                          EBPC_model, EBPC_parameters)

DSA_directing_patterns = DSAPC_realistic(DSA_model,DSA_target_patterns, DSAPC_parameters, ...
                                        EBPC_model, EBPC_parameters);
EBPCed_patterns = EBPC(EBPC_model,DSA_directing_patterns, EBPC_parameters);
end
```

FIG. 7

```
function EBPCed_patterns = COUPLED_GLOBAL_FLOW(DSA_target_patterns, ...
                                               DSA_model, EBPC_model, ...
                                               COUPLED_GLOBAL_FLOW_parameters)

EBPCed_patterns_current(1) = initialize_EBPCed_patterns(DSA_model, DSA_target_patterns, ...
                                                       EBPC_model);

for iteration =1:COUPLED_GLOBAL_FLOW_parameters.n_iterations
    wafer_patterns = apply_EBPC_model(EBPCed_patterns_current(iteration), ...
                                      EBPC_model);
    DSA_patterns = apply_DSA_model(wafer_patterns, ...
                                   DSA_model);
    residual = compute_DSAPC_residual(DSA_patterns, ...
                                      DSA_target_patterns);
    if(DSAPC_norm(residual) < DSAPC_parameters.tolerance)
        EBPCed_patterns = EBPCed_patterns_current(iteration);
        return
    else
        EBPCed_patterns_current(iteration+1) = COUPLED_GLOBAL_FLOW_update(...
                                               EBPCed_patterns_current(iteration), ...
                                               DSA_target_patterns, ...
                                               residual, ...
                                               EBPC_model, DSA_model, ...
                                               COUPLED_GLOBAL_FLOW_parameters);
    end
end
disp('Coupled global flow iterations did not converge');
end
```

FIG. 8

METHODS FOR FABRICATING INTEGRATED CIRCUITS INCLUDING GENERATING E-BEAM PATTERNS FOR DIRECTED SELF-ASSEMBLY

TECHNICAL FIELD

The technical field relates generally to methods for fabricating integrated circuits, and more particularly relates to methods for fabricating integrated circuits including generating e-beam patterns for directed self-assembly.

BACKGROUND

Decreasing device size and increasing device density has traditionally been a high priority for the manufacturing of integrated circuits. Optical and electron beam (e-beam) lithography have been a driving force for device scaling. Conventional lithography is limited to about 80 nm pitch for single exposure patterning. While double and other multi-patterning processes can realize smaller pitch, these approaches are expensive and more complex.

Directed self-assembly (DSA), a technique that aligns self-assembling polymeric materials on a lithographically defined directing or guide pattern, is a potential option for extending current lithography beyond its pitch and resolution limits. The self-assembling materials, for example, are block copolymers (BCPs) that in the case of diblock copolymers consist of a "A" homopolymer covalently attached to a "B" homopolymer, which are deposited over a lithographically defined directing pattern on a semiconductor substrate. The lithographically defined directing pattern is a pre-pattern (hereinafter "DSA directing pattern") that is encoded with spatial chemical and/or topographical information (e.g., chemical epitaxy and/or graphoepitaxy) and serves to direct the self-assembly process and the pattern formed by the self-assembling materials. Subsequently, by annealing the DSA polymers, the A polymer chains and the B polymer chains undergo phase separation to form an A polymer region and a B polymer region that are registered to the underlying DSA directing pattern to define a nanopattern (hereinafter "DSA pattern"), typically at a scale smaller than the scale of a DSA directing pattern. Then, by removing either the A polymer block or the B polymer block by wet chemical or plasma-etch techniques, a mask is formed for transferring the DSA pattern to the underlying semiconductor substrate.

Generating an e-beam pattern for lithographically defining the DSA directing pattern to accurately form the shape of the DSA pattern requires proper accounting of a multitude of physical effects that occur during the DSA process to form the DSA pattern. A typical DSA process employing e-beam lithography involves generating an e-beam pattern, writing the e-beam pattern on a resist layer overlying a semiconductor substrate, developing the resist layer to create the DSA directing pattern, spin coating the pre-patterned developed resist with BCP, and annealing and developing the BCP to form the DSA pattern, and etching the developed DSA pattern. Unfortunately, current approaches for generating an e-beam pattern for defining a DSA directing pattern to form a DSA pattern do not fully account for the physical effects that occur during the DSA process.

Accordingly, it is desirable to provide methods for fabricating integrated circuits including generating an e-beam pattern for lithographically defining a DSA directing pattern to accurately form a DSA pattern. Moreover, it is desirable to provide methods for fabricating integrated circuits including generating an e-beam pattern for lithographically defining a DSA directing pattern that more fully account for the physical effects that occur during a DSA process. Furthermore, other desirable features and characteristics of the present invention will become apparent from the subsequent detailed description and the appended claims, taken in conjunction with the accompanying drawings and this background.

BRIEF SUMMARY

Methods for fabricating integrated circuits are provided herein. In accordance with an exemplary embodiment, a method for fabricating an integrated circuit includes generating an e-beam pattern for forming a DSA directing pattern on a semiconductor substrate. The DSA directing pattern is configured to guide a self-assembly material deposited thereon that undergoes directed self-assembly (DSA) to form a DSA pattern. Generating the e-beam pattern includes using a computing system, inputting a DSA target pattern. Using the computing system, the DSA target pattern, a DSA model, and an EBPC (e-beam proximity correction) model, an output EBPCed pattern is produced for an e-beam writer to write on a resist layer that overlies the semiconductor substrate.

In accordance with another exemplary embodiment, a method for fabricating an integrated circuit is provided. The method includes generating an e-beam pattern for forming a DSA directing pattern on a semiconductor substrate. The DSA directing pattern is configured to guide a self-assembly material deposited thereon that undergoes directed self-assembly (DSA) to form a DSA pattern. Generating the e-beam pattern includes using a computing system, inputting a DSA target pattern. Using the computing system, a DSA model, and the DSA target pattern, a DSA PC algorithm is run to produce an output DSA directing pattern. Using the computing system, an EBPC model, and the output DSA directing pattern, an EBPC algorithm is run to produce an output EBPCed pattern. Using the computing system, communicating the output EBPCed pattern to an e-beam writer to write on a resist layer that overlies the semiconductor substrate.

In accordance with another exemplary embodiment, a method for fabricating an integrated circuit is provided. The method includes generating an e-beam pattern for forming a DSA directing pattern on a semiconductor substrate. The DSA directing pattern is configured to guide a self-assembly material deposited thereon that undergoes directed self-assembly (DSA) to form a DSA pattern. Generating the e-beam pattern includes using a computing system, inputting a DSA target pattern and an initial EBPCed pattern. Using the computing system, applying an EBPC model to the initial EBPCed pattern to produce a first output DSA directing pattern. Using the computing system, applying a DSA model to the first output DSA directing pattern to produce a first output DSA pattern. Using the computing system, computing a DSA PC residual between the DSA target pattern and the first output DSA pattern. Using the computing system, comparing the DSA PC residual to a predetermined DSA PC tolerance and if the DSA PC residual is greater than the predetermined DSA PC tolerance, then adjusting the initial EBPCed pattern to generate a first updated EBPCed pattern.

BRIEF DESCRIPTION OF THE DRAWINGS

The various embodiments will hereinafter be described in conjunction with the following drawing figures, wherein like numerals denote like elements, and wherein:

FIGS. 4-8 are various MATLAB-like pseudocodes for use in fabricating an integrated circuit in accordance with various exemplary embodiments.

DETAILED DESCRIPTION

Figure 1:
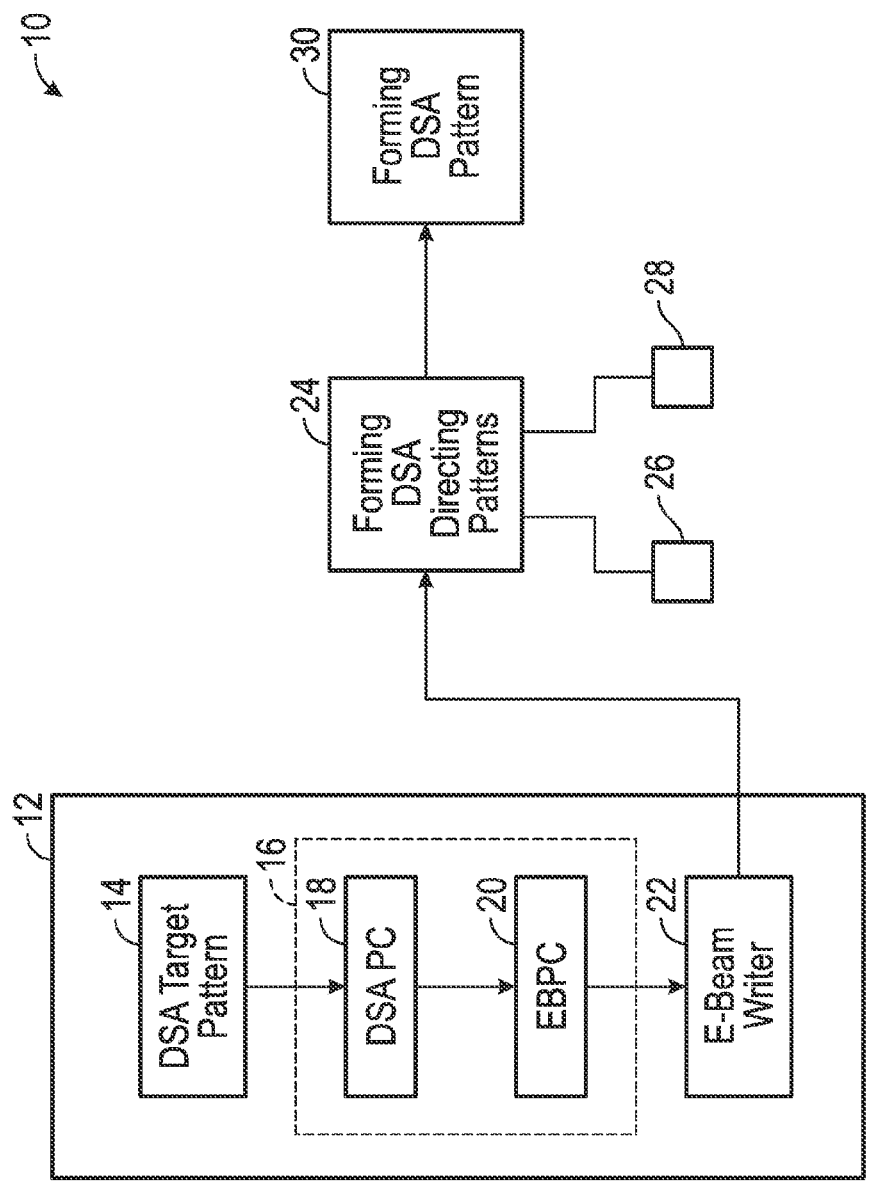
FIGS. 1-2 are block diagrams of methods for fabricating an integrated circuit in accordance with various exemplary embodiments.

The following Detailed Description is exemplary in nature and is not intended to limit the various embodiments or the application and uses thereof. Furthermore, there is no intention to be bound by any theory presented in the preceding background or the following detailed description.

Various embodiments contemplated herein relate to methods for fabricating integrated circuits. The exemplary embodiments taught herein generate an e-beam pattern for forming a DSA directing pattern on a semiconductor substrate. The DSA directing pattern is for guiding a self-assembly material (e.g., BCP) that is deposited on the DSA directing pattern and that undergoes directed self-assembly (DSA), e.g., phase separation during annealing, to form a DSA pattern. In an exemplary embodiment, the e-beam pattern is generated by inputting a DSA target pattern into a computing system. The DSA target pattern is a desired or predetermined DSA pattern that is to be fabricated on the semiconductor substrate using the DSA process.

In an exemplary embodiment, a DSA PC (directed self-assembly process/proximity correction) algorithm is run using the computing system, a DSA model, and the DSA target pattern to produce an output DSA directing pattern. The DSA PC algorithm is an algorithm that takes as an input the DSA target pattern that is to be fabricated using the DSA process and provides as an output the output DSA directing pattern (e.g., a chemical epitaxy pre-pattern or a graphoepitaxy pre-pattern). The DSA PC algorithm takes into account the physical effects that occur during the DSA process including annealing and etching of the self-assembly material to ensure that the DSA pattern resulting from DSA processing of the DSA directing pattern is close to or substantially matches the DSA target pattern. The DSA PC algorithm uses the DSA model that computes the DSA fabricated pattern given the DSA directing pattern.

In an exemplary embodiment, an EBPC (e-beam proximity correction) algorithm is run using the computing system, an EBPC model, and the output DSA directing pattern to produce an output EBPCed pattern. The EBPC algorithm is an algorithm that takes as an input the EBPC target pattern (e.g., polygons) that needs to be written on a resist layer that overlies the semiconductor substrate and provides as an output the output EBPCed pattern, i.e., the pattern (or shots) communicated to a direct write e-beam tool (e-beam writer). The EBPC algorithm takes into account various e-beam writing effects (e.g., forward and backward electron scattering, e-beam long range and short range proximity effects, e-beam resists exposure and development, and the like) to ensure that when the e-beam writer writes the EBPCed pattern, the actual pattern written on the resist layer is close to or substantially matches the EBPC target pattern. The EBPC algorithm uses the EBPC model that computes the pattern written on the resist layer by the e-beam writer, given the pattern (or shots) communicated to e-beam writer.

In an exemplary embodiment, the output EBPCed pattern is communicated to the e-beam writer for writing on the resist layer. Because a multitude of physical effects that occur during the DSA process including from resist layer e-beam writing on through to etching of the phase separated self-assembly material have been accounted for in defining the output EBPCed pattern, the e-beam patterned resist layer can be used to form a DSA directing pattern that accurately forms the shape of the DSA pattern, e.g., target the DSA pattern.

FIG. 1 is a block diagram of a method 10 for fabricating an integrated circuit (IC) in accordance with an exemplary embodiment. The described process steps, procedures, and materials are to be considered only as exemplary embodiments designed to illustrate to one of ordinary skill in the art methods for practicing the methods contemplated herein; the methods are not limited to these exemplary embodiments. Various steps in the manufacture of ICs are well known and so, in the interest of brevity, many conventional steps will only be mentioned briefly herein or will be omitted entirely without providing the well-known process details.

The method 10 includes generating an e-beam pattern (step 12) for forming a DSA directing pattern on a semiconductor substrate. As will be discussed in further detail below, the e-beam pattern is a pattern to be written by a direct write electron beam lithography tool (e-beam writer) on a resist layer that overlies the semiconductor substrate. The DSA directing pattern is for guiding a DSA material deposited on the DSA directing pattern during a DSA process in which the DSA material undergoes DSA (e.g., nano-size/scale phase separation that is registered to the DSA directing pattern) to form a DSA pattern.

As illustrated and will be described in further detail below, a DSA target pattern is input into a computer system (step 14). The DSA target pattern is used in a decoupled global flow 16 that includes a DSA model and an EBPC model to account for a multitude of physical effects that occur during the DSA process.

In an exemplary embodiment, using the computing system, the DSA model, and the DSA target pattern, a DSA PC algorithm is run (step 18) to produce an output DSA directing pattern. As discussed above, the DSA PC algorithm is an algorithm that takes as an input the DSA target pattern that is to be fabricated using the DSA process and provides as an output the output DSA directing pattern (e.g., a chemical epitaxy pre-pattern or a graphoepitaxy pre-pattern, e.g., confinement wells). The DSA PC algorithm takes into account the physical effects that occur during the DSA process including annealing and etching of the self-assembly material to ensure that the DSA pattern resulting from DSA processing of the DSA directing pattern is close to or substantially matches the DSA target pattern. The DSA PC algorithm uses the DSA model that computes the DSA fabricated pattern given the DSA directing pattern. One example of a generic DSA PC algorithm is included in the MATLAB-like pseudocode illustrated in FIG. 4.

In this example, the DSAPC( ) function takes as inputs the DSA model, the DSA target patterns, and the parameters of the DSA PC algorithm and outputs the DSA directing patterns. In the DSAPC( ) function, the DSA directing patterns are generated iteratively. These patterns are initialized and the iterations are run within an iterative loop. On each pass of the loop (for each iteration), the DSA model is first applied to the current directing patterns to compute the residual (the discrepancy between the DSA patterns corresponding to the given directing patterns and the target DSA patterns). Depending on the value of a certain cost function, and dependent on the residual, the current directing patterns are either output as the output of the DSAPC( ) function, if the norm of the residual is sufficiently small, or are updated for the next iteration to further reduce the cost function value corresponding to the residual. Other DSA PC algorithms known to those skilled in the art may also be used.

The term "target DSA patterns" is used herein to denote the patterns that are desired or predetermined to be fabricated on the semiconductor substrate using the DSA process. For instance, these patterns may include lines and spaces, isolated lines, contact holes, and other features, e.g., typically polygon type features, needed for IC fabrication. Target DSA patterns can be specified as a set of polygons or a set of features found that by smooth curves.

In an exemplary embodiment, the method 10 continues by running an EBPC algorithm (step 20) using the computing system, the EBPC model, and the output DSA directing pattern to produce an output EBPCed pattern for an e-beam writer to write on a resist layer that overlies the semiconductor substrate. As discussed above, the EBPC algorithm is an algorithm that takes as an input the EBPC target pattern (e.g., polygons) that needs to be written on the resist layer and provides as an output the output EBPCed pattern, i.e., the pattern (or shots) communicated to the e-beam writer. The EBPC algorithm takes into account various e-beam writing effects (e.g., forward and backward electron scattering, e-beam long range and short range proximity effects, e-beam resists exposure and development, and the like) to ensure that when the e-beam writer writes the EBPCed pattern, the actual pattern written on the resist layer is close to or substantially matches the EBPC target pattern. The EBPC algorithm uses the EBPC model that computes the pattern written on the resist layer by the e-beam writer, given the pattern (or shots) communicated to e-beam writer. One example of a generic EBPC algorithm is included in the MATLAB-like pseudocode illustrated in FIG. 5.

In this example, the EBPC( ) function takes as inputs the EBPC model, the EBPC target patterns, and the parameters of the EBPC algorithm and outputs the EBPCed patterns. In the EBPC( ) function, the EBPCed patterns are generated iteratively. These patterns are initialized and the iterations are run within an iterative loop. On each pass of the loop (for each iteration), the EBPC model is first applied to the current EBPCed patterns to compute the residual (the discrepancy between the wafer patterns corresponding to the given current EBPCed patterns and the target EBPC patterns). Depending on the value of a certain cost function, EBPC_norm( ) and dependent on the residual, the current EBPCed patterns are either output as the output of the EBPC( ) function, if the norm of the residual is sufficiently small, or are updated for the next iteration to further reduce the cost function value corresponding to the residual. Other EBPC algorithms known to those skilled in the art may also be used.

The term "target EBPC patterns" is used herein to denote the patterns that are desired or predetermined to be fabricated in the developed resist film using the e-beam process. For instance, these patterns may include lines and spaces, isolated lines, contact holes, and other features, e.g., typically polygon type features, needed for IC fabrication. Target EBPC patterns can be specified as a set of polygons or a set of features bounded by smooth curves.

In an exemplary embodiment, the decoupled global flow 16 is a fully decoupled global flow in which the DSA PC algorithm and the EBPC algorithm are run 18 and 20 consecutively as described above with the output of the DSA PC algorithm being passed on as an input to the EBPC algorithm. One example of a generic fully decoupled global flow is presented by the MATLAB-like pseudocode illustrated in FIG. 6.

In this example, the fully decoupled global flow( ) function takes as inputs the DSA target patterns, the DSA model, the parameters of the DSA PC algorithm, the EBPC model, and the parameters of the EBPC algorithm. In the fully decoupled global flow( ) function, the EBPCed patterns are generated by sequentially running the DSA PC algorithm and the EBPC algorithm in which the output from the DSA PC program (i.e., DSA directing patterns) is the input to the EBPC algorithm, and the output from the EBPC algorithm is the EBPCed patterns.

In another exemplary embodiment, the decoupled global flow 16 is a decoupled global flow with realistic EBPC targets. The decoupled global flow with realistic EBPC targets operates similarly to the fully decoupled global flow except that a modified DSA PC algorithm (e.g., DSA PC algorithm using manufacturability constraints for an e-beam process) is used in which the DSA PC iterations are conducted in such a way that the final DSA directing patterns are realistic EBPC targets. In particular, the targets for the EBPC algorithm include a set of polygonal features. However, especially for the advanced lithography nodes, the EBPC algorithm may not always fully match the polygonal targets. One example is with corner rounding in which the corner of a polygon may be difficult to match using the feature written by e-beam lithography. Because of corner rounding of certain polygon features or other like limitations, an advanced lithographic node EBPC may use realistic EBPC targets, i.e., EBPC targets that the EBPC algorithm can match with a higher accuracy. Such realistic EBPC targets can be obtained from the original polygonal EBPC targets by applying geometrical corner rounding or spline interpolation to the edges of the original polygons. Utilizing the realistic EBPC targets is particularly useful for DSA applications in which the directing patterns are patterned using e-beam lithography and the EBPC algorithm is run to apply the EBPC corrections and to compute the EBPCed patterns. If the DSA PC algorithm outputs the DSA directing patterns that are not a realistic EBPC target, the EBPC algorithm will match these directing patterns potentially with an error, resulting in a potential discrepancy between the desired DSA directing patterns and the DSA directing patterns fabricated using e-beam lithography. One example of a generic decoupled global flow with realistic EBPC targets is presented by the MATLAB-like pseudocode illustrated in FIG. 7.

In this example, the DECOUPLED_GLOBAL_FLOW_REALISTIC( ) function takes as inputs the DSA target patterns, the DSA model, the parameters of the DSA PC algorithm, the EBPC model, and the parameters of the EBPC algorithm. In the DECOUPLED_GLOBAL_FLOW_REALISTIC( ) function, the EBPCed patterns are generated by sequentially running a DSA PC algorithm (a function DSAPC_realistic( )) outputting realistic EBPC targets, and the EBPC algorithm in which the output from the DSAPC_realistic( ) function (i.e., DSA directing patterns, which are realistic EBPC targets) is the input to the EBPC algorithm, and the output from the EBPC algorithm is the EBPCed patterns. The DSA PC realistic algorithm is the DSA PC algorithm but modified so that the DSA PC iterations also use the EBPC model and the parameters of the EBPC algorithm. Utilizing the DSA_PC_realistic( ) function ensures that the DSA directing patterns are realistic EBPC targets that reduce the discrepancy between the directing patterns desired by the DSA PC algorithm and the patterns that can be fabricated on the semiconductor substrate using e-beam lithography.

The method 10 continues by communicating the output EBPCed pattern to the e-beam writer (step 22). To form the DSA directing pattern (step 24), a resist layer overlying a semiconductor substrate is patterned to form a patterned resist layer by using the e-beam writer to write an e-beam pattern on the resist layer, and subsequently developing the resist layer using well known techniques. In an exemplary embodiment, the e-beam pattern closely or substantially matches the EBPC target pattern. Because a multitude of physical effects of the DSA process have been accounted for in defining the output EBPCed pattern, the patterned resist layer can be used to define a DSA directing pattern that accurately forms the shape of the DSA pattern.

In one embodiment, the resist layer is patterned for forming the DSA directing pattern having a graphoepitaxy surface (step 26) as is known in the art. In an exemplary embodiment, the graphoepitaxy surface includes confinement wells that define pre-pattern openings. In an alternative embodiment, the patterned photoresist layer is used for forming the DSA directing pattern having a chemical epitaxy surface (step 28) as is known in the art.

The method 10 continues by forming the DSA pattern (step 30). In an exemplary embodiment in which the DSA directing pattern has the graphoepitaxy surface, the DSA pattern is formed (step 30) by depositing a self-assembly material (BCP) on the graphoepitaxy surface including into the pre-pattern opening. In an alternative embodiment in which the DSA directing pattern has the chemical epitaxy surface, the self-assembly material is deposited overlying the chemical epitaxy surface. The self-assembly material is then annealed and etched to define the DSA pattern. The self-assembly material is deposited, annealed, and etched as described above using well known techniques.

Figure 2:
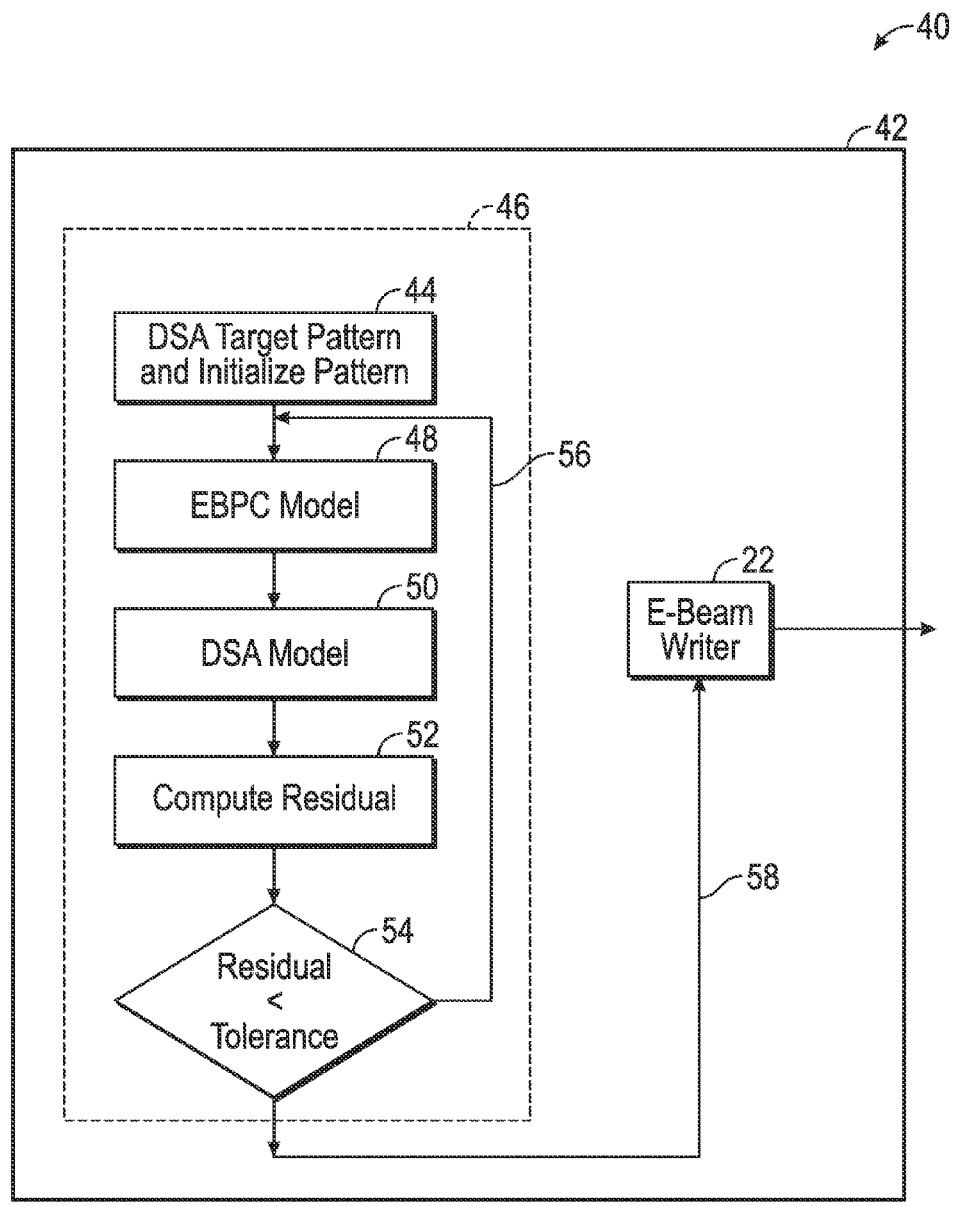

FIG. 2 is a schematic illustration of a block diagram of a method 40 for fabricating an IC in accordance with an exemplary embodiment. The method 40 includes generating an e-beam pattern (step 42) for forming a DSA directing pattern on a semiconductor substrate. As discussed above, the DSA directing pattern is for guiding a DSA material deposited on the DSA directing pattern during a DSA process in which the DSA material undergoes DSA (e.g., nano-size/scale phase separation that is registered to the DSA directing pattern) to form a DSA pattern.

As illustrated, a DSA target pattern and an initial EBPCed pattern are input into a computing system (step 44). The term "initial EBPCed pattern" is used herein to denote an initial guess or approximation of a pattern to be provided to an e-beam writer for writing on a resist layer for defining the DSA directing pattern for forming the DSA target pattern. The DSA target pattern and the initial EBPCed pattern are used in a coupled global flow 46 that includes the EBPC and DSA models as discussed above to account for a multitude of physical effects that occur during the DSA process.

In an exemplary embodiment, using the computing system, the EBPC model is applied (step 48) to the initial EBPCed pattern to produce an output DSA directing pattern. The DSA model is then applied (step 50) to the output DSA directing pattern to produce an output DSA pattern.

In an exemplary embodiment, a DSA PC residual is computed (step 52) between the DSA target pattern and the output DSA pattern. The DSA PC residual is compared to a predetermined DSA PC tolerance (step 54). The application of the EBPC and DSA models, computing of the DSA PC residual, and comparing the DSA PC residual to the predetermined DSA PC tolerance are cooperatively configured as an iterative loop 56. If the DSA PC residual is greater than the predetermined DSA PC tolerance, then the initial EBPCed pattern is adjusted to generate an updated EBPCed pattern that is fed back to the iterative loop 56 for one or more additional iterations. When the current iteration DSA PC residual is less than the predetermined DSA PC tolerance, then the corresponding current iteration, updated EBPCed pattern is outputted from the iterative loop 56 (step 58) as the output EBPCed pattern.

One example of a generic coupled global flow 46 that includes an EBPC model and a DSA model is included in the MATLAB-like pseudocode illustrated in FIG. 8.

In this example, the COUPLED_GLOBAL_FLOW( ) function takes as inputs the DSA target patterns, the DSA model, the EBPC model, and the parameters of the COUPLED_GLOBAL_FLOW and outputs the EBPCed patterns (i.e., patterns provided to the e-beam writer). In the COUPLED_GLOBAL_FLOW( ) function, the EBPCed patterns are generated iteratively. These patterns are initialized by inputting the initial EBPCed patterns and the iterations are run within an iterative loop. On each pass of the iterative loop (for each iteration), the EBPC model is applied to the current EBPCed patterns to produce the current output wafer patterns; and the DSA model is applied to the current output wafer patterns to produce the current output DSA patterns to compute the residual (the discrepancy between the current output DSA pattern and the DSA target patterns). Depending on the value of a certain cost function, and dependent on the residual, the current iteration EBPCed patterns are either output as the output of the COUPLED_GLOBAL_FLOW( ) function, if the norm of the residual is sufficiently small, or are updated for the next iteration to further reduce the cost function value corresponding to the residual.

The method 40 continues by communicating the output EBPCed pattern to the e-beam writer (step 22) for direct e-beam writing of a resist layer for forming a patterned resist layer. Because a multitude of physical effects of the DSA process have been accounted for in defining the output EBPCed pattern, the patterned resist layer can be used to define a DSA directing pattern (step 24 in FIG. 1) that accurately forms the shape of the DSA pattern (step 30 in FIG. 1).

Figure 3:
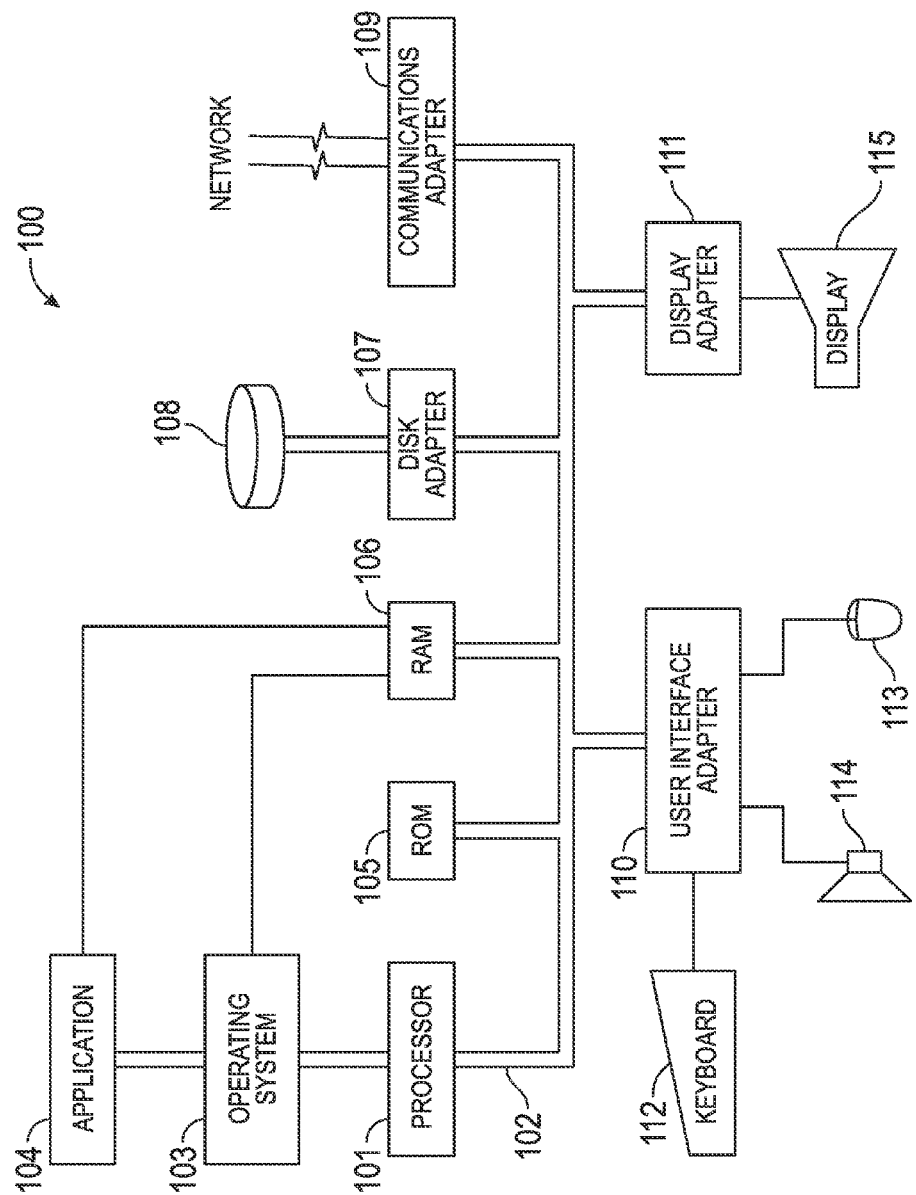
FIG. 3 is a schematic illustration of a computing system arranged in accordance with an exemplary embodiment.

FIG. 3 is a schematic illustration of a block diagram of a computing system 100 arranged in accordance with an exemplary embodiment. The various embodiments disclosed herein can be implemented on the computing system 100. The computing system 100 is also representative of a hardware environment for the present disclosure. For example, the computing system 100 may have a processor 101 coupled to various other components by a system bus 102.

An operating system 103 may run on the processor 101 and provide control and coordinate the functions of the various components of FIG. 3. An application 104 in accordance with the principles of examples of the present disclosure may execute in conjunction with the operating system 103 and provide calls and/or instructions to the operating system 103 where the calls/instructions implement the various functions or services to be performed by the application 104.

A read-only memory ("ROM") 105 may be coupled to a system bus 102 and can include a basic input/output system ("BIOS") that can control certain basic functions of the computing system 100. A random access memory ("RAM") 106 and a disk adapter 107 may also be coupled to system bus 102. It should be noted that software components, including the operating system 103 and the application 104, may be loaded into a RAM 106, which may be computing system's main memory for execution. The disk adapter 107 may be provided which can be an integrated drive electronics ("IDE") or parallel advanced technology attachment ("PATA") adapter, a serial advanced technology attachment ("SATA") adapter, a small computer system interface ("SCSI") adapter, a universal serial bus ("USB") adapter, an IEEE 1394 adaptor, or any other appropriate adapter that communicates with a disk unit 108, e.g., disk drive.

The computing system 100 may further include a communications adapter 109 coupled to the system bus 102. The communications adapter 109 may interconnect the system bus 102 with an external network (not shown) thereby facilitating the computing system 100 to communicate with other similar and/or different devices.

Input/Output ("I/O") devices may also be connected to the computing system 100 via a user interface adapter 110 and a display adapter 111. For example, a keyboard 112, a mouse 113, and a speaker 114 may be interconnected to the system bus 102 through the user interface adapter 110. Data may be provided to the computing system 100 through any of these example devices. A display monitor 115 may be connected to the system bus 102 by any display adapter 111. In this example manner, a user can provide data or other information to the computing system 100 through the keyboard 112 and/or the mouse 113, and obtain output from the computing system 100 via the display 115 and/or the speaker 114.

Accordingly, methods for fabricating integrated circuits including generating an e-beam pattern for forming a DSA directing pattern on a semiconductor substrate have been described. In an exemplary embodiment, generating the e-beam pattern includes using a computing system, inputting a DSA target pattern. Using the computing system, the DSA target pattern, a DSA model, and an EBPC model, an output EBPCed pattern is produced for an e-beam writer to write on a resist layer that overlies the semiconductor substrate.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
   generating an e-beam pattern for forming a DSA directing pattern on a semiconductor substrate, wherein the DSA directing pattern is configured to guide a self-assembly material deposited thereon that undergoes directed self-assembly (DSA) to form a DSA pattern, and wherein generating the e-beam pattern comprises:
   using a computing system, inputting a DSA target pattern; and
   using the computing system, the DSA target pattern, a DSA model, and an EBPC model to produce an output EBPCed pattern for an e-beam writer to write on a resist layer that overlies the semiconductor substrate.

2. The method of claim 1, wherein using the DSA target pattern, the DSA model, and the EBPC model comprises running a DSA PC algorithm using the DSA model and the DSA target pattern to produce an output DSA directing pattern.

3. The method of claim 2, wherein using the DSA target pattern, the DSA model, and the EBPC model comprises running an EBPC algorithm using the EBPC model and the output DSA directing pattern to produce the output EBPCed pattern.

4. The method of claim 2, wherein using the DSA target pattern, the DSA model, and the EBPC model comprises running the DSA PC algorithm using manufacturability constraints for an e-beam process to produce the output DSA directing pattern with realistic e-beam targets that can be fabricated in e-beam lithography.

5. The method of claim 1, wherein inputting the DSA pattern comprises inputting the DSA target pattern and an initial EBPCed pattern, and wherein using the DSA target pattern, the DSA model, and the EBPC model comprises using the computing system, the DSA target pattern, the initial EBPCed pattern, the DSA model, and the EBPC model to produce the output EBPCed pattern.

6. The method of claim 1, wherein inputting the DSA target pattern comprises inputting a line and space pattern, an isolated line pattern, a contact hole pattern, and/or other polygon pattern.

7. The method of claim 1, further comprising:
   patterning the resist layer using the e-beam writer and the output EBPCed pattern.

8. The method of claim 7, wherein patterning the resist layer comprises:
   writing on the resist layer using the e-beam writer programmed with the output EBPCed pattern; and
   subsequently developing the resist layer.

9. The method of claim 7, wherein patterning the resist layer comprises patterning the resist layer to form the DSA directing pattern having a graphoepitaxy surface that defines a pre-pattern opening.

10. The method of claim 9, further comprising depositing the self-assembly material on the graphoepitaxy surface including into the pre-pattern opening.

11. The method of claim 10, further comprising phase separating the self-assembly material to define the DSA pattern.

12. The method of claim 11, further comprising etching the DSA pattern to form a mask for transferring the DSA pattern to the semiconductor substrate.

13. The method of claim 7, wherein patterning the resist layer comprises patterning the resist layer to form a patterned resist layer, and wherein the method further comprises:
   using the patterned resist layer to form the DSA directing pattern having a chemical epitaxy surface.

14. The method of claim 13, further comprising depositing the self-assembly material on the chemical epitaxy surface.

15. The method of claim 14, further comprising phase separating the self-assembly material to define the DSA pattern.

16. The method of claim 15, further comprising etching the DSA pattern to form a mask for transferring the DSA pattern to the semiconductor substrate.

17. A method for fabricating an integrated circuit comprising:
   generating an e-beam pattern for forming a DSA directing pattern on a semiconductor substrate, wherein the DSA directing pattern is configured to guide a self-assembly material deposited thereon that undergoes directed self-assembly (DSA) to form a DSA pattern, and wherein generating the e-beam pattern comprises:
   using a computing system, inputting a DSA target pattern;
   using the computing system, a DSA model, and the DSA target pattern, running a DSA PC algorithm to produce an output DSA directing pattern;
   using the computing system, an EBPC model, and the output DSA directing pattern, running an EBPC algorithm to produce an output EBPCed pattern; and
   using the computing system, communicating the output EBPCed pattern to an e-beam writer to write on a resist layer that overlies the semiconductor substrate.

18. The method of claim 17, wherein using the computing system, the DSA model, and the DSA target pattern comprises running the DSA PC algorithm using manufacturability constraints for an e-beam process to produce the output DSA directing pattern with realistic e-beam targets that can be fabricated in e-beam lithography.

19. A method for fabricating an integrated circuit comprising:

generating an e-beam pattern for forming a DSA directing pattern on a semiconductor substrate, wherein the DSA directing pattern is configured to guide a self-assembly material deposited thereon that undergoes directed self-assembly (DSA) to form a DSA pattern, and wherein generating the e-beam pattern comprises:

using a computing system, inputting a DSA target pattern and an initial EBPCed pattern;

using the computing system, applying an EBPC model to the initial EBPCed pattern to produce a first output DSA directing pattern;

using the computing system, applying a DSA model to the first output DSA directing pattern to produce a first output DSA pattern;

using the computing system, computing a DSA PC residual between the DSA target pattern and the first output DSA pattern; and using the computing system, comparing the DSA PC residual to a predetermined DSA PC tolerance and if the DSA PC residual is greater than the predetermined DSA PC tolerance, then adjusting the initial EBPCed pattern to generate a first updated EBPCed pattern.

20. The method of claim 19, wherein applying the EBPC and DSA models, computing the DSA PC residual, and comparing the DSA PC residual cooperate to define an iterative loop, and wherein the method further comprises:

using the computing system, inputting the first updated EBPCed pattern to the iterative loop to iteratively apply the EBPC and DSA models to produce a current iteration, updated EBPCed pattern and correspondingly a current iteration DSA PC residual that is less than the predetermined DSA PC tolerance; and using the computing system, outputting the current iteration, updated EBPCed pattern from the iterative loop, wherein the current iteration, updated EBPCed pattern is for an e-beam writer to write on a resist layer that overlies the semiconductor substrate.

\* \* \* \* \*